United States Patent [19]

Hayes

[11] Patent Number: 4,947,121

[45] Date of Patent: Aug. 7, 1990

[54] APPARATUS AND METHOD FOR ENHANCED MULTIPLE COIL NUCLEAR MAGNETIC RESONANCE (NMR) IMAGING

[75] Inventor: Cecil E. Hayes, Wauwatosa, Wis.

[73] Assignee: General Electric Company, Milwaukee, Wis.

[21] Appl. No.: 446,277

[22] Filed: Dec. 5, 1989

Related U.S. Application Data

[62] Division of Ser. No. 234,360, Aug. 19, 1988, Pat. No. 4,885,541.

[51] Int. Cl.⁵ .............................................. G01R 33/20
[52] U.S. Cl. .................................... 324/322; 324/318
[58] Field of Search ............... 324/300, 307, 309, 318, 324/322, 312, 313, 314; 128/653; 333/219, 237

[56] References Cited

U.S. PATENT DOCUMENTS 4,165,479  8/1979  Mansfield ............................ 324/313

Primary Examiner—Michael J. Tokar
Attorney, Agent, or Firm—Quarles & Brady

[57] ABSTRACT

A nuclear magnetic resonance (NMR) signal acquisition apparatus includes a cylindrical array of overlapping coils. Coupling of currents between coils due to re-radiation of received signals, in particular noise currents, is reduced by presenting a high impedance to each coil, thereby reducing the current circulating in each coil. A PREDAMP circuit is disclosed which utilizes the input impedance of a preamplifier, transformed through a quarter-wavelength transmission line segment, to achieve the high input impedance for the coil. As a result, multiple images, each with a high signal-to-noise ratio (SNR), can be simultaneoulsy obtained. A method is disclosed for combining the multiple images into a composite image with optimum SNR, taking into account the phase shifts between images resulting from the spatial orientation of the coils.

2 Claims, 2 Drawing Sheets

APPARATUS AND METHOD FOR ENHANCED MULTIPLE COIL NUCLEAR MAGNETIC RESONANCE (NMR) IMAGING

CROSS REFERENCE

This application is a division of U.S. patent application no. 07/234,360, filed on Aug. 19, 1988, now U.S. Pat. No. 4,885,541.

BACKGROUND OF THE INVENTION

The presents invention relates to nuclear magnetic resonance (NMR) imaging and, more particularly, to methods and apparatus for simultaneously receiving different NMR response signals from each of a plurality of closely-positioned radio-frequency (RF) coils, having substantially reduced interactions therebetween.

Present-day NMR imaging systems utilize receiver coils which surround the entire sample (for example, a human patient) which is to be imaged. These "remote coils" have the advantage that the sensitivity to individual spins is, to a first approximation, substantially constant over the entire region being imaged. Although this uniformity is not strictly characteristic of such remote coils, it is substantially constant to a sufficient degree that most present-day reconstruction techniques assume a constant coil sensitivity. Because of their large size, such remote coils suffer from two disadvantages: first, a relative insensitivity to individual spins; and, second, a relatively large inductance and, therefore, a low self-resonant frequency.

It is well known that surface coils do not have a uniform sensitivity to individual spins without the region; images produced using surface coils require additional compensation for such inhomogeneity. Surface coils can, however, be made much smaller in geometry that remote coils and for medical diagnostic use can be applied near, or on, the body surface of the sample patient. This is especially important where attention is being directed to imaging a small region within the sample, rather than an entire anatomical cross section. Because the surface coil reception element can be located closer to the spins of interest, a given spin will produce a larger EMF, at a given Larmor frequency, in a surface coil that in a remote coil. The use of a surface coil also reduces the noise contribution from electrical losses in the body, with respect to a corresponding remote coil, while maximizing the desired signal.

NMR imaging systems thus typically use a small surface coil for localized high resolution imaging. A single surface coil of diameter D gives the highest possible signal-to-noise ratio (SNR) for that volume around a depth D inside an infinite conducting half space. However, the single surface coil can only effectively image that region with lateral dimensions comparable to the surface coil diameter D. Therefore, the use of a surface coil necessarily restricts the field-of-view and inevitably leads to a trade-off between resolution and field-of-view. Since the fundamental limitation of the SNR of a surface coil is its intrinsic signal-to-noise ratio, wherein the noise resistance is attributable to currents induced in the sample (for example, a patient in a medical NMR imaging situation) by the radio-frequency (RF) receiving coil. Larger coils induce greater patient sample losses and therefore have a larger noise resistance; smaller coils have a lower noise resistance but, in turn, restrict the field of view to a smaller region.

It is highly desirable to extend the field-of-view by providing a set of surface coils arrayed with overlapping fields-of-view. However, it is desirable to at the same time maintain the high SNR of the single surface coils, if at all possible. Specifically, when obtaining signals from two or more coils simultaneously, it is important for the noise voltages in each coil to be as uncorrelated as possible. There will be some unavoidable noise correlation if the coils share a common noise source. But there can be unnecessary noise correlations if the noise currents in one coil induce voltages in other coils.

It is also highly desirable to be able to construct a single optimal image, which maximizes the signal-to-noise ratio is each pixel of the composite single image, from the partial-image data of each of the plurality of surface coils in the array.

SUMMARY OF THE INVENTION

A nuclear magnetic resonance (NMR) signal acquisition apparatus according to the present invention comprises a first coil, a first matching means, and a first preamplifier. The first coil has a source impedance $R_S$. The first preamplifier has an optimum source impedance $R_{opt}$ and an input impedance $R_{in}$, with $R_{in}$ being less than $R_{opt}$. The first matching means connects the first coil to the first preamplifier such that the source impedance of the first coil $R_S$ is transformed by the matching means to be approximately equal to the optimum source impedance $R_{opt}$ at the point of connection between the first matching means and the first preamplifier. At the same time, the low input impedance of the first preamplifier is transformed by the first matching means to be a value higher than the optimum source impedance $R_{opt}$ at the point of connection between the first matching means and the first coil.

One object of the present invention is to reduce the reradiation of noise currents circulating in a resonant NMR receiver coil. Without such attenuation, noise in one coil can be coupled into other coils in the system, thereby reducing the noise performance of the system. In this invention, the first matching means provides an impedance connected across the first coil which is a transformed value of the preamplifier input impedance Rin. That impedance is necessarily higher than the optimum source impedance Ropt, so that circulating currents, particularly noise currents, in the first coil are reduced.

An aspect of this invention is that the input impedance itself of the first preamplifier participates in the manipulation of the impedance presented to the first coil. It is thereby possible to maintain optimum noise performance while at the same time reducing noise currents in the first coil. The first matching means may comprise a transmission line segment having a length approximately equal to one quarter of a wavelength at the NMR signal frequency. In order to match the source impedance $R_S$ to the optimum source impedance $R_{opt}$, the the quarter-wavelength transmission line segment may have a characteristic impedance $Z_o$ determined by the equation:

$$Z_o = \sqrt{R_S R_{opt}}.$$

In another aspect of the invention, the preamplifier may include an input stage comprising an inductor-capacitor (L-C) network for establishing the input impedance of the preamplifier at the NMR signal frequency. The ratio of the optimum source impedance $R_{opt}$ to the input impedance $R_{in}$ may be greater than 20.

Another object of the invention is provide for clamping of large voltages encountered during a transmit phase of the NMR signal acquisition. The apparatus of this invention may include at least one half-wavelength transmission line segment interposed between the first matching means and the first preamplifier, and clamping means attached to at least one end of the half-wavelength transmission line segment. The clamping means thereby provides the desired attenuation. The half-wavelength transmission line segment has a characteristic impedance approximately equal to the optimum source impedance $R_{opt}$ to maintain optimum matching effectiveness for noise reduction purposes.

Yet another object of this invention is to provide an array of coils for simultaneous acquisition of multiple images. In that case, each coil is connected to a matching means and preamplifier similar to those according to this invention described above. Then, all of the coils in the array enjoy reduced noise currents due to the high impedance presented by each respective matching means to the associated coil, and noise coupling between the coils is consequently reduced.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
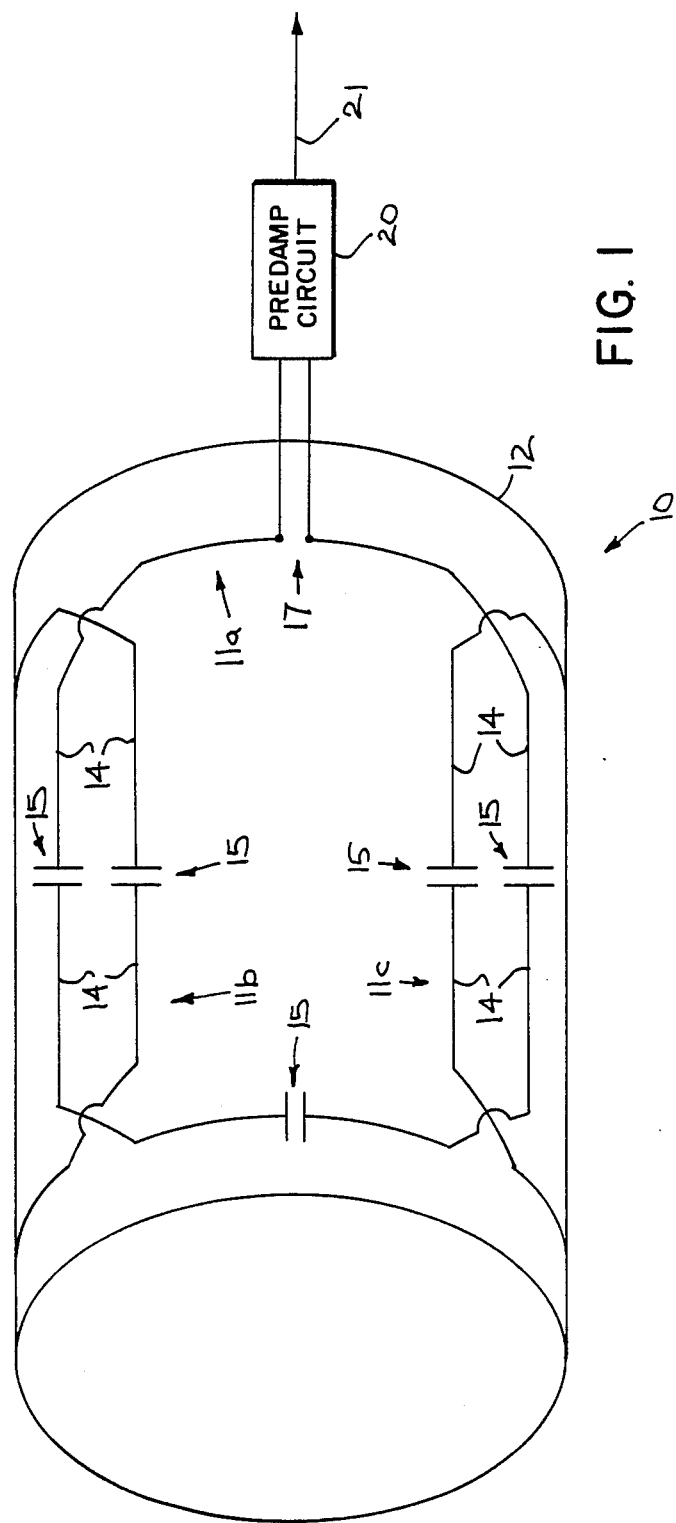
FIG. 1 is a perspective view of a nuclear magnetic resonance (NMR) signal acquisition apparatus according to the present invention.

Referring to FIG. 1, a coil assembly 10 comprises four individual coils 11a–11d (only coils 11a–11c are visible in FIG. 1) placed on the surface of a cylindrical coil form 12. The coil form 12 is approximately 6 inches in diameter and 5 inches in length, and formed of a suitable insulting material. The coils 11a–11d are roughly square in shape and each coil 11a–11d spans approximately 110° around the cylindrical form 12. As a result, the longitudinal edges of each of the coils 11a–11d overlaps with its next nearest neighboring coil. Each coil 11a–11d includes conductors 14, functioning as inductive sections, in series with capacitors 15. Each coil 11a–11d is thereby essentially a series L-C circuit. The conductors 14 are formed of ⅜ inch wide copper tape fastened onto the surface of the form 12. At the corners of each coil 11a–11d, the conductors 14 are run diagonally so that the intersections between coils are at right angles. Where conductors 14 cross, one of the conductors is routed as a small rectangular bridge over the other conductor 14. Each coil 11a–11d includes four conductors 14 separated by gaps. Three of the gaps are bridged by capacitors 15 soldered onto the copper tape. The other gap 17 is open, and serves as a connection point for processing circuitry described below.

Surface coil arrays are generally known in the art for use in NMR signal acquisition. A common problem in such coil arrays is the coupling of noise between coils in the array. This phenomenon occurs as noise currents as part of an incident signal on one coil can essentially "re-radiate", causing additional noise currents in a nearby mutually coupled coil. The mutual coupling between coils can be alleviated to some extent by their relative placement, for example orthogonally or with a certain degree of overlap. However, ideal placement of the respective coils is often mandated by a particular application, and can not always be accomplished in an ideal manner. Further, one object of this invention to provide an enhanced composite image based on a novel combination of separate images obtained from multiple coils with overlapping fields of views, particularly when the coils in the array are not in the same plane. For example, the coil structure of FIG. 1 is suitable for imaging limbs of a human subject, and mutual coupling between the coils 11a–11d can not be eliminated through placement alone.

In order to provide an even greater reduction of noise coupling between coils in an array, one aspect of this invention is to reduce the noise currents induced in each individual coil 11a–11d, thereby greatly attenuating the reradiation of that noise to other coils in the array. The circuit for providing that function is integrated into a preamplification stage for each coil 11a–11d, and is referred to herein as a PREDAMP circuit 20. The PREDAMP circuit 20 is coupled to coil 11a across the gap 17, and amplifies the signal incident on the coil 11a in such a manner, described in detail below, that circulating currents, both signal and noise, in the coil 11a are minimized. The amplified signal is then output on line 21 for processing by the remainder of the NMR system. Although only one PREDAMP circuit 20 is shown in FIG. 1 connected to coil 11a, it should be understood that each other coil 11b–11d is also connected to its own PREDAMP circuit 20, thereby providing for simultaneous acquisition of signals 21 corresponding to all four coils 11a–11d.

Figure 2:
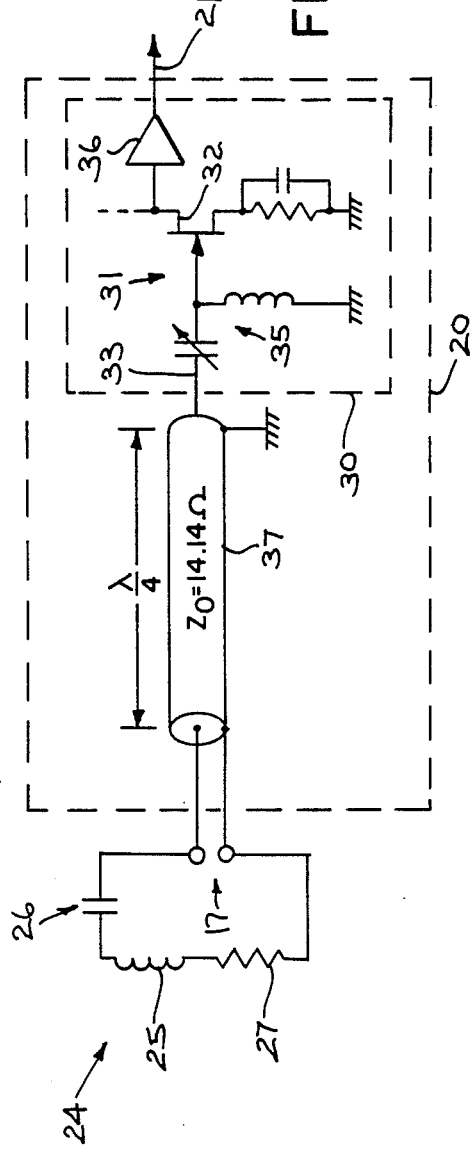
FIG. 2 is a schematic diagram for the PREDAMP circuit which forms a part of the apparatus of FIG. 1.

Referring to FIG. 2, each coil 11a–11d can be modeled as an equivalent series R-L-C circuit, hereinafter referred to as coil 24. The "L" element 25 of coil 24 corresponds to the inductance of the conductors 14 at the Larmor frequency of the sample of interest, approximately 64 MHz in this embodiment. The "C" element 27 corresponds to the capacitors 15 distributed across the gaps between conductors 14. And the "R" term of the coil 24 represents the net source impedance of the coil 24, which is predominantly due to the loading caused by the sample under study, for example a human patient, which is usually a fairly lossy medium.

In prior coil/preamplifier combinations, the series coil elements were closed, usually by a capacitor (not shown), to provide an optimum impedance match for the transmission line and preamplifier used. It was therefore important in prior coils to maintain a fairly high quality factor, or "Q", to maximize the signal developed across the matching capacitor.

The PREDAMP circuit 20 operates in a substantially different manner by presenting a high impedance across the coil terminals 17, substantially lowering the Q of the coil 24. As a result, currents circulating in the coil 24 are suppressed, and re-radiation that would have been caused by those currents are likewise reduced.

Amplifiers typically used as NMR preamplifiers can be characterized by their input impedance, e.g. circuit loading, and an optimum source impedance. The optimum source impedance is used to describe that source impedance which provides the best noise performance, in terms of the signal-to-noise ratio (SNR), for driving the preamplifier 30. Driving the preamplifier 30 with an imbalanced source impedance, e.g. other than the optimum, results in degradation of the noise performance of the preamplifier 30. Therefore, one problem with lowering the Q of the coil 24 is that is must be done in such a way as match the optimum source impedance of the preamplifier 30. A second concern in lowering the Q of coil 24 is that it it is not feasible to do so simply by adding resistance, either is series or parallel. The introduction of resistance at a non-absolute zero temperature would result in additional noise in itself, usually more than could be eliminated by lowering the coil Q. The problem of implementing a PREDAMP circuit is then twofold; (1) to present a high - impedance to the coil terminals 17, while at the same time (2) presenting the optimum source impedance to the preamplifier 30. Both of these objective are achieved in a PREDAMP circuit 20 according to this invention by utilizing the input impedance itself, of the preamplifier 30, as a part of a matching network for directly manipulating the Q of the coil 24.

Still referring to FIG. 2, a PREDAMP circuit according to this invention includes a preamplifier 30 with a very low input impedance. In fact it is preferred for the input impedance to be much lower than the optimum source impedance, e.g. a maximum ratio of optimum source impedance to input impedance. The reason for maximizing that ratio is so that the input impedance itself may be transformed, via a matching network, to present a high impedance to the coil 24, while at the same time, the relatively low source impedance 27 of the coil 24 is matched to the higher optimum source impedance of the preamplifier 30.

As an illustrative example, the preamplifier 30 includes an input stage 31 based on a Gallium-Arsenide (GaAs) field effect transistor (FET) 32. An input line 33 for the preamplifier 30 is coupled to the gate of the GaAs FET 32 via an adjustable L-C network 35. The resulting input stage 31 exhibits an optimum source impedance of approximately 50 ohms, while the L-C network 35 is adjusted to present an input impedance, at the frequency of interest, as low as practical. In this example, an input impedance of approximately 1.5 ohms is assumed. The output of GaAs FET 32 is then amplified in further stages 36 to produce the output signal 21.

Matching of the preamplifier 30 to the coil 24 is performed by a transmission line segment 37. The transmission line segment 37 has a length equal to one quarter wavelength ($\lambda/4$) at the frequency of interest. As is known in the art, a quarter-wave transmission line segment transforms the impedance seen at one end ($R_{end1}$), with respect to the impedance connected to the other end ($R_{end2}$), according to the formula:

$$R_{end1} = \frac{Z_o^2}{R_{end2}} \quad (1)$$

or equivalently:

$$Z_o = \sqrt{R_{end1} * R_{end2}} \quad (2)$$

Where: $Z_o$ is the characterisetic impedance of a quarter-wave transmission line segment A typical value for the source impedance 27 of the coil 4 is approximately 4 ohms. In order to match that 4 ohm source impedance to the optimum source impedance of 50 ohms for amplifier 30, equation (2) yields a value for $Z_o$ of $\sqrt{200}$, or 14.14 ohms. Then, with a value of 14.14 ohms, the impedance seen across the gap 17 of coil 24 is obtained by applying equation (1) to yield a value of 133 ohms. Therefore, the effective impedance connected across the coil 24 is 133 ohms, or approximately 2.6 times greater than the customary 50 ohms used with prior coil/preamplifier combinations. Similarly, that factor of a 2.6 increase impedance results in the desired effect of a corresponding decrease in the current circulating in coil 24.

Figure 3:
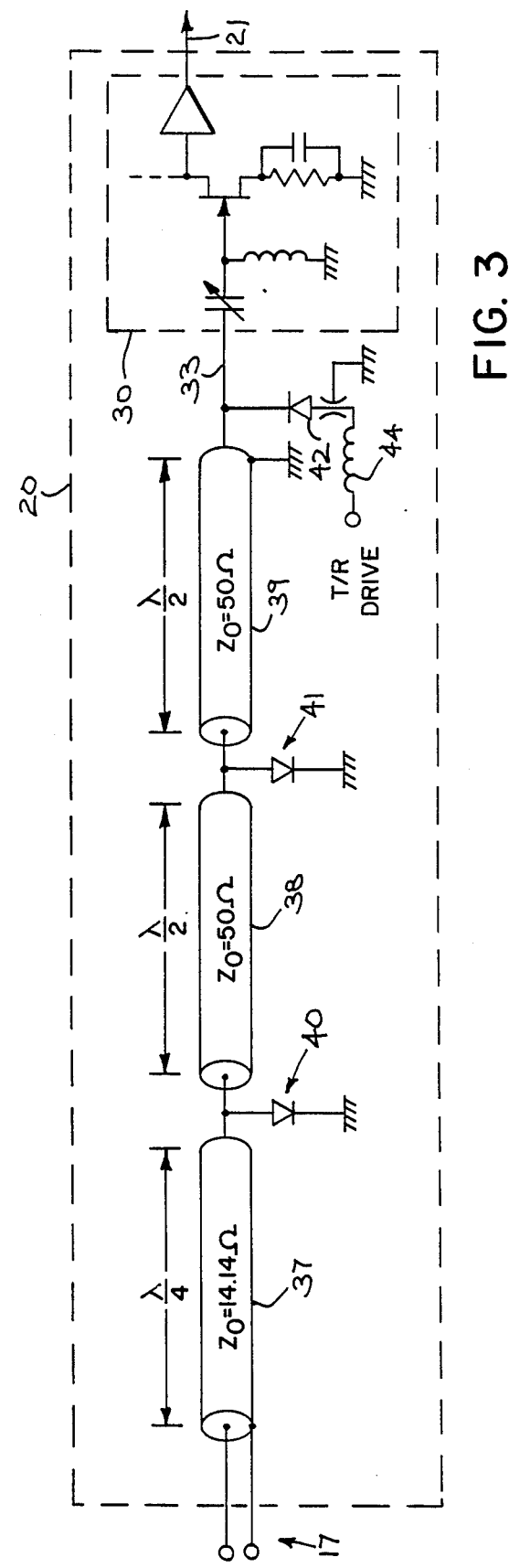
FIG. 3 is a schematic diagram of an alternate construction for the PREDAMP circuit of FIG. 1.

Referring to FIG. 3, an alternative embodiment of the PREDAMP circuit 20 includes the same low impedance, low noise preamplifier 30 and the same quarter-wave transmission line segment 37 as in the previous embodiment. The embodiment of FIG. 3 further includes half-wave transmission line segments 38 and 39, each with a characteristic impedance equal to the optimum source impedance of the preamplifier, or 50 ohms in this case. The half-wave transmission line segments 38 and 39 are therefore matched to the preamplifier 30 on one end and the quarter-wave transmission line segment 37 on the other end, and so do not effect the transformation of impedances, or PREDAMP effect, as described above.

One purpose of the half-wave transmission line segments 38 and 39 is to permit the insertion of clamping PIN diodes 40 and 41 to attenuate high voltages during the transmit phase. A third PIN diode 42 connects to preamplifier input 33 through an inductor 44. The inductor 44 is in turn driven by a transmit/receive (T/R) drive signal, which places a very low impedance clamp, on the order of 0.25 ohms, on the input 33 to preamplifier 30 during transmit. That lower impedance when clamped translates, according to equations (1) and (2) above, into approximately 800 ohms across terminals 17 of the coil 24 (not shown in FIG. 3), which is even more effective in reducing currents in the coil during transmit.

It should be apparent that even greater increases in effective coil impedance are possible by increasing the optimum-source-impedance-to-input-impedance ratio. By making that ratio higher, and appropriately adjusting $Z_o$, circulating currents in the coil 24 can be further reduced. And if that ratio is made high enough, coupling of noise currents to other coils is effectively eliminated by the PREDAMP circuit 20 alone, regardless of the relative positioning of the coils. This latter aspect is particularly useful in conjunction with flexible coil arrays in which the relative positioning of the coils are not known in advance and vary from patient to patient.

Referring again to FIG. 1, the use of a PREDAMP circuit 20 connected to each of the coils 11a–11d greatly reduces the coupling of noise between coils, as just described. It is therefore practical using this invention to simultaneously acquire high SNR images from each coil 11a–11d independently. A further object of this invention, described below, is to combine the independent images so obtained into a composite image with both an enlarged field of view as compared to a single coil, and an enhanced SNR.

The independent images from the coils 11a–11d are formed using conventional quadrature phase detectors and baseband processors (not shown) for each coil. The result is a set of complex numbers, describing each volume element (voxel) in the image, stored in a conventional processing apparatus (not shown), which are processed according to the below described method.

In particular, the method of this invention is most effective for arrays of coils in which the coils are not all in the same plane. In that case, as in the array of FIG. 1, a signal produced in the common field of view of the array will be received with varying phase shifts in the different coils of the array. One objective of this invention is to combine those signals to achieve the optimum SNR at all locations in a multiple surface coil array by taking advantage of the spatially dependent phase shifts therein. Better than $\sqrt{2}$ noise improvements (i.e., the quadrature reception advantage) are possible at certain locations near the coils.

In the complex image data obtained as described above, there are spatial variations of phase from pixel to pixel in a given individual image as well as phase variations from image to image for a fixed pixel. These phase variations effect how the correlated noise is incorporated in the composite image.

In general, when a signal 21 has a high SNR, the signal serves as a reference for the phase detection of the noise. That is, only the component of noise that is instantaneously in phase with the signal tends to alter the magnitude of the image. The component of noise that is out of phase with the signal tends to change the phase but not the magnitude of the image. A particular effect arises from the inhomogeneity of the B1 field generated by a unit current in each individual coil. The signal E induced in the coil by a given voxel is given by [3]

$$E = -\frac{d}{dt}\{B1_{xy} \cdot m\} \quad (3)$$

where:
m is the nuclear magnetic moment of the voxel, and $B1_{xy}$ is the xy vector component of B1.

When a body coil (not shown) is used to excite the nuclei, m initially points in the same direction for all voxels, i.e., they have a common phase reference such as the y-axis in the laboratory frame. The scalar product introduces a phase factor due to the variations in direction of $B1_{xy}$ from voxel to voxel and from coil to coil. Thus for two adjacent surface coils, the signals for a given pixel may have very different phases in the two images. Hence, correlated noise induced in both coils need not be detected with the same phase reference for a given pixel in both images. The treatment of the correlated noise can differ from pixel to pixel in the composite image. In some cases, the correlation can be nulled or reversed in certain pixels. For example, at a pixel where the B1 of one coil is antiparallel with the B1 of the other coil, the signals are 180 degrees out of phase; so the correlated noise will add to the magnitude of one coil's image and subtract from the magnitude of the other coil's image. Combining the two images will eliminate the correlated noise in that pixel.

The method of the present invention combines the images acquired simultaneously from each coil 11a–11d of the array by using both magnitude and phase information from each voxel. In the illustrative example that follows, the combination of two images from two of the coils 11a–11d is explained in detail using subscripts i = 1,2. Later, it is explained how the exemplary two coil case can be expanded to combine the images from an arbitrary number of coils.

Each coil has a signal $s_i$ and noise $n_i$ assumed to be:

$$s_i = S_i e^{j\theta_i} \quad n_i = N_i e^{j\phi_i} \quad (4)$$

$S_i(r)$ is proportional the magnitude of $B1_{xy}$ and therefore depends on the location r of the pixel. $\theta(r)$ equals the angle between $B1_{xy}$ and the initial direction of m. The noise does not have any explicit spatial dependence because it results essentially from an integration over the sample volume. $N_i$ and $\phi_i$ are each random variables which vary from one data acquisition to the next. A typical probability distribution for N and $\phi$ may be, for example:

$$p(N,\phi)drd\phi = \frac{1}{\sigma^2} e^{-(N^2/\sigma^2)} 2NdN\left(\frac{d\phi}{2\pi}\right) \quad (5)$$

This corresponds to Gaussian distributions for both the real and imaginary components of N and a uniform distribution of $\phi$ independent of N. For this case, $<N^2> = \sigma^2$, where the symbols $<>$ denote an ensemble average over many data acquisitions.

Although both $n_1$ and $n_2$ are random variables, they may be correlated. The average noise power for the sum of two noise voltages is $$<\text{noise power}> = <(n_1+n_2)(n_1+n_2)^*>$$
$$= <n_1^2> + <n_2^2> + 2<n_1n_2\cos(\phi_1-\phi_2)> \quad (6)$$

In equation (6), the last term $2<n_1n_2\cos(\phi_1-\phi_2)>$ accounts for any correlation between the two noises.

There are several methods according to this invention to combine the complex image data pixel by pixel. The simplest method, referred to herein as the mean image, takes a weighted sum of the image magnitudes for each pixel. The composite signal with noise included is given by:

$$(\text{mean image}) = |s_1+n_1| + \eta|s_2+n_2| \quad (7)$$

where $\eta$ is the weighting factor.

The second approach, referred to herein as the rms image, takes the square root of a weighted sum of the two image magnitudes squared. That is:

$$(\text{rms image}) = \{(s_1+n_1)(s_1+n_1)^* + \eta(s_2+n_2)(s_2+n_2)^*\}^{\frac{1}{2}} \quad (8)$$

where:
* denotes the complex conjugate operation.

To determine the effect of noise on the composite image, the variance of the magnitude of each pixel is calculated according to the formula:

$$\text{variance} = <\text{mag}^2> - <\text{mag}>^2 \quad (9)$$

with mag = (mean image) or mag = (rms image). The signal-to-noise ratio SNR is given by the noiseless signal divided by the square root of the variance. The SNR is then optimized by finding its maximum with respect to the weighting factor, $\eta$. The calculated SNR and optimum η, designated $\eta_{opt}$ can be derived from the above equations assuming a high SNR. Omitting those calculations for simplicity, the results are shown below for both the mean image and the rms image.

Using the mean image approach, the calculations give:

$$SNR = \frac{(S_1 + S_2\eta)\sqrt{2}}{\sqrt{<N_1^2> + <N_1^2>\eta^2 + 2\eta x}} \tag{10}$$

$$\eta_{opt} = \frac{S_2<N_1^2> - S_1 x}{S_1<N_2^2> - S_2 x} \tag{11}$$

where:

$$x = \cos(\theta_1-\theta_2)<N_1N_2\cos(\phi_1-\phi_2)> + \sin(\theta_1-\theta_2)<N_1N_2\sin(\phi_1-\phi_2)>$$

For the rms image approach, the results are:

$$SNR = \frac{(S_1^2 + S_2^2\eta)\sqrt{2}}{\sqrt{S_1^2<N_1^2> + S_1^2<N_2^2>\eta^2 + 2S_1S_2\eta x}} \tag{12}$$

$$\eta_{opt} = \frac{S_1(S_2<N_1^2> - S_1 x)}{S_2(S_1<N_2^2> - S_2 x)} \tag{13}$$

Note that the $\eta_{opt}$ for the rms image is equal to a factor $(S_1/S_2)$ times the optimum η for the mean image. Combining equations (10) and (11) can be seen to yield the same SNR for the composite image as the combination of equations (12) and (13).

The expression denoted by x includes the correlation of the noise in the two coils. The angle $\theta_1-\theta_2$ is equal to the angle between the $B1_{xy}$ vectors of the coils at a given voxel. The term $<N_1N_2\cos(\phi_1-\phi_2)>$ gives the traditional correlation term as in equation (6). The term $<N_1N_2\sin(\phi_1-\phi_2)>$ is assumed to be equal to zero. Based on that assumption, the correlated noise is controlled by the coil geometry through the $\cos(\theta_1-\theta_2)$ factor. At points where the flux lines from the two coils are orthogonal, $\cos(\theta_1-\theta_2)$ is zero and the two coils have the SNR improvements due to quadrature reception for that voxel. If the flux lines are anti-parallel, then $\cos(\theta_1-\theta_2) = -1$ and the SNR is even better than for quadrature detection (provided there is a positive noise correlation). When x=0, the optimum η for the rms image equals one and the optimum image corresponds to taking the square root of the sum of the individual SNR's squared.

In order to construct the composite image with optimum SNR, the weighting factor η must be evaluated for each pixel. Relative values for $<N_1^2>$, $<N_2^2>$, and $<N_1N_2\cos(\phi_1-\phi_2)>$ can be obtained by taking several data acquisitions during a prescan period with zero transmitter power. The values of $S_1$, $\theta_1$, $S_2$, and $\theta_2$ can be taken from the magnitude and phase of the images reconstructed for each individual coil provided no unequal phase shifts are introduced by the receiver channels. This procedure avoids the need to calculate the values and directions of $B1_{xy}$ for each pixel. The latter calculation is not trivial for a coil array whose position or shape can vary from one patient to the next. For regions of low signal to noise, η=1 is a good initial approximation when using the rms image approach.

A coil array in which all coils are in the same plane is equivalent to taking $\theta_1=\theta_2$ for all pixels. For the special case of a spinal probe made up of a single row of coils along the z-axis, $\theta_1$ equals $\theta_2$, and an optimal image is obtained according to the above described method of this invention. But more particularly, for coil arrays that extend tangentially around the body or head, $-1 \leq \cos(\theta_1-\theta_2) \leq +1$, and the SNR obtained by the method of this invention will always equal or exceed the SNR produced by other prior methods which do not take into account the spatially imposed phase shifts. The amount of improvement in SNR depends on the relative signal strength, the degree of noise correlation, and the phase factor $\cos(\theta_1-\theta_2)$. For the case where:

$$<N_1^2> = <N_2^2> \tag{14}$$

$$\rho = \frac{<N_1N_2\cos(\phi_1-\phi_2)>}{<N_1^2>} \tag{15}$$

$$\beta = \frac{S_2}{S_1} \tag{16}$$

$$c = \cos(\theta_1-\theta_2) \tag{17}$$

combining equations (12) and (13) gives:

$$SNR_{opt} = \sqrt{\frac{2S_1^2}{<N_1^2>}} \sqrt{\frac{1 - 2\beta\rho c + \beta^2}{1 - \rho^2 c^2}} \tag{18}$$

The first factor of equation (18) is the SNR obtained when only a single coil is used. The second factor is the enhancement due to optimum addition of the second coil's signal. The table below gives the enhancement factor EF for two values of ρ for a range of β and c.

| β | c | EF(ρ = .4) | EF(ρ = .2) |
|---|---|---|---|
| 1.00 | +1 | 1.195 | 1.291 |
|  | 0 | 1.414 | 1.414 |
|  | −1 | 1.825 | 1.581 |
| .75 | +1 | 1.070 | 1.147 |
|  | 0 | 1.250 | 1.250 |
|  | −1 | 1.604 | 1.393 |
| .50 | +1 | 1.006 | 1.046 |
|  | 0 | 1.118 | 1.118 |
|  | −1 | 1.401 | 1.229 |

When $\cos(\theta_1-\theta_2)=0$, the dependence on the correlation coefficient ρ drops out and the enhancement starts at $\sqrt{2}$ for equal signals and decreases as the second coil's signal strength (or SNR) decreases. When $\cos(\theta_1-\theta_2)$ is greater than zero, the multi-coil enhancement becomes less effective as the correlations increase. The converse is true for negative values of $\cos(\theta_1-\theta_2)$; the enhancement factor can exceed the $\sqrt{2}$ value given by quadrature reception. Hence, the SNR can be substantially improved in certain regions of the image by incorporating the coil induced phase shifts in the composite image reconstruction. In the table above, up to 54% improvement in SNR occurs when the cosine factor is not ignored.

Considering the additional geometric dependence of each pixel's SNR via the $\cos(\theta_1-\theta_2)$ term, the best choice of coil size and spacing for a wrap around body or head multiple coil array may need to be determined empirically. By using a PREDAMP circuit according to the present invention, as described above, to prevent cross coupling of the coils, the need to overlap coils to reduce their mutual inductance is reduced. A calculated SNR averaged over the desired imaging volume could actually be optimized by varying the configuration of individual coils in the array. The SNR calculation would combine coil loading and noise correlations with the geometric factors arising from spatial dependance of each coil's B1 vector.

It should then be apparent to those skilled in the art that the method of this invention can then be extended to any number of coils by utilizing appropriate matrix operations instead of the specific two coil example given. For example, for N surface coils, let S be an N dimensional vector $(S_1, S_2, ...., S_N)$ corresponding to the signals for a given voxel from N surface coils. Let $\rho$ be an $N \times N$ matrix whose ij element is:

$$\rho ij = <N_i N_j \cos(\phi_i - \phi_j)> \cos(\theta_i - \theta_j).$$

Then the composite signal should be:

$$\text{COMPOSITE SIGNAL} = \sqrt{S \cdot (\rho^{-1}) \cdot S}.$$

For uncorrelated noise, this reduces to the square root of the sum of the squares of the SNR for each coil.

What is claimed is:

1. A method for combining nuclear magnetic resonance (NMR) signals from M separate NMR receiver coils to produce a composite image represented by a plurality of picture elements (pixels), where M represents a number greater than one which is the number of separate receiver coils, the method comprising the steps of:

(a) acquiring a plurality of noise data samples $n_i$ from each coil (i) of the M receiver coils during a time period when no NMR signal is present, in which each noise data sample is represented by;

$$n_i = N_i e^{j\phi i}$$

(b) producing a set of noise products by computing cross products of the noise data samples for each combination (i,j) of the M receiver coils, and averaging all of the cross products for each said combination, the set of noise products being represented by;

$$<N_i N_j \cos(\phi_i - \phi_j)>$$

where the brackets <> denote an average over the plurality of noise data samples for each combination (i,j);

(c) acquiring separate raw imaging data simultaneously from each of the M receiver coils when an NMR signal is present;

(d) transforming the raw image data from each of the M receiver coils into separate spatial domain images for each of the M receiver coils, where each spatial domain image includes a plurality of spatial domain image pixels, each spatial domain image pixel being represented by a magnitude $S_i$ and a phase $\theta_i$ for each receiver coil (i); and (e) computing each pixel in the composite image on a pixel by pixel basis by performing the steps of:

(f) forming a noise matrix $\rho ij$ according to the formula;

$$\eta ij = <N_i N_j \cos(\phi_i - \phi_j)> \cos(\theta_i - \theta_j),$$

for each combination (i,j) of the M receiver coils;

(g) inverting the noise matrix to produce $\rho^{-1}$; and (h) computing each pixel in the composite image according to the formula;

$$\text{COMPOSITE SIGNAL} = \sqrt{S \cdot (\rho^{-1}) \cdot S},$$

where S represents a one dimensional vector formed from the $S_i$ magnitudes from each receiver coil (i) of the M receiver coils.

2. The method according to claim 1 in which:

the noise in each receiver coil is assumed to be uncorrelated to the noise in all of the other receiver coils;

the set of noise products in step (b) are computed according to the formula;

$$<N_i J_j>, \text{ for } i=j, \text{ and } 0 \text{ for } i \neq j;$$

the spatial domain image pixels transformed in step (d) are represented by a magnitude $S_i$ only; and in which the noise matrix $\rho ij$ formed in step (f) thereby reduces to:

$$\rho ij = <N_i N_j>, \text{ for } i=j, \text{ and}$$

$$\rho ij = 0, \text{ for } i \neq j.$$

* * * * *

UNITED STATES PATENT AND TRADEMARK OFFICE
CERTIFICATE OF CORRECTION

PATENT NO. : 4,947,121
DATED : August 7, 1990
INVENTOR(S) : Cecil E. Hayes

It is certified that error appears in the above-identified patent and that said Letters Patent is hereby corrected as shown below:

In Column 6,
at Line 5, Change "characterisetic" to --characteristic--.

In Column 6,
at Line 8, change "4" (first occurance) to --24--.

In Column 9,
at Line 10, change "$<N_1^2> + <N_1^2>$" to --$<N_1^2> + <N_2^2>$--.

In Column 12,
at Line 20, (Claim 1) change "$\eta ij$" to --$\rho ij$--.

In Column 12,
at Line 39, (Claim 2) Change "$<N_iJ_j>$" to --$<N_iN_j>$--.

Signed and Sealed this

Eighteenth Day of February, 1992

*Attest:*

HARRY F. MANBECK, JR.

*Attesting Officer*    *Commissioner of Patents and Trademarks*